United States Patent [19]
Clinton et al.

[11] Patent Number: 5,836,007
[45] Date of Patent: Nov. 10, 1998

[54] METHODS AND SYSTEMS FOR IMPROVING MEMORY COMPONENT SIZE AND ACCESS SPEED INCLUDING SPLITTING BIT LINES AND ALTERNATE PRE-CHARGE/ACCESS CYCLES

[75] Inventors: Kim P. N. Clinton, Essex Junction; Frank Ray Keyser III, Colchester; Wendell Ray Larsen, Essex Junction, all of Vt.

[73] Assignee: International Business Machines Corporation, Armonk, N.Y.

[21] Appl. No.: 528,177

[22] Filed: Sep. 14, 1995

[51] Int. Cl.⁶ ........................................... G11C 7/00
[52] U.S. Cl. .................. 365/205; 365/189.02; 365/203; 365/230.02
[58] Field of Search ................ 365/205, 189.02, 365/189.01, 230.02, 203

[56] References Cited

U.S. PATENT DOCUMENTS

| | | | |
|---|---|---|---|
| Re. 32,682 | 5/1988 | Eaton et al. | 365/189 |
| Re. 33,694 | 9/1991 | McElroy | 365/149 |
| 4,056,811 | 11/1977 | Baker | 365/189 |
| 4,233,675 | 11/1980 | Karp et al. | 365/205 |
| 4,351,034 | 9/1982 | Eaton, Jr. et al. | 365/189 |
| 4,366,559 | 12/1982 | Misaizu et al. | 365/205 |
| 4,413,330 | 11/1983 | Chao et al. | 365/205 |
| 4,528,646 | 7/1985 | Ochii et al. | 365/203 |
| 4,584,672 | 4/1986 | Schutz et al. | 365/203 |
| 4,656,613 | 4/1987 | Norwood et al. | 365/208 |
| 4,658,377 | 4/1987 | McElroy | 365/149 |
| 4,694,433 | 9/1987 | Wiedmann | 365/189.02 |
| 4,701,885 | 10/1987 | McElroy | 365/189 |
| 4,758,987 | 7/1988 | Sakui | 365/189 |
| 4,833,653 | 5/1989 | Mashiko et al. | 365/203 |
| 4,908,797 | 3/1990 | McElroy | 365/207 |
| 4,916,667 | 4/1990 | Miyabayashi et al. | 365/207 |
| 4,982,368 | 1/1991 | Arimoto | 365/206 |
| 5,025,421 | 6/1991 | Cho | 365/230.05 |
| 5,053,997 | 10/1991 | Miyamato et al. | 365/189.06 |
| 5,148,401 | 9/1992 | Sekino et al. | 365/230.05 |
| 5,243,574 | 9/1993 | Ikeda | 365/207 |
| 5,317,212 | 5/1994 | Wahlstrom | 307/465 |
| 5,335,199 | 8/1994 | Aoyama | 365/230.05 |
| 5,361,229 | 11/1994 | Chiang et al. | 365/189.05 |
| 5,416,743 | 5/1995 | Allan et al. | 365/203 |
| 5,440,506 | 8/1995 | Longway et al. | 365/104 |
| 5,440,513 | 8/1995 | Smith | 365/203 X |

*Primary Examiner*—David C. Nelms
*Assistant Examiner*—Huan Hoang
*Attorney, Agent, or Firm*—Heslin & Rothenberg, P.C.

[57] ABSTRACT

A memory system having split logical bit lines and interleaved pre-charge/access cycles is provided. A bit line access circuit supports multiple conductors per logical bit line and pre-charges the conductors before access cycles thereto. The access cycles for one logical bit line are performed simultaneous with the pre-charge cycles for another logical bit line by the access circuit. Virtual reading is provided for eliminated memory cells. The memory system can be used in a programmable gate array having memory cells distributed throughout for programming respective programmable resources.

53 Claims, 6 Drawing Sheets

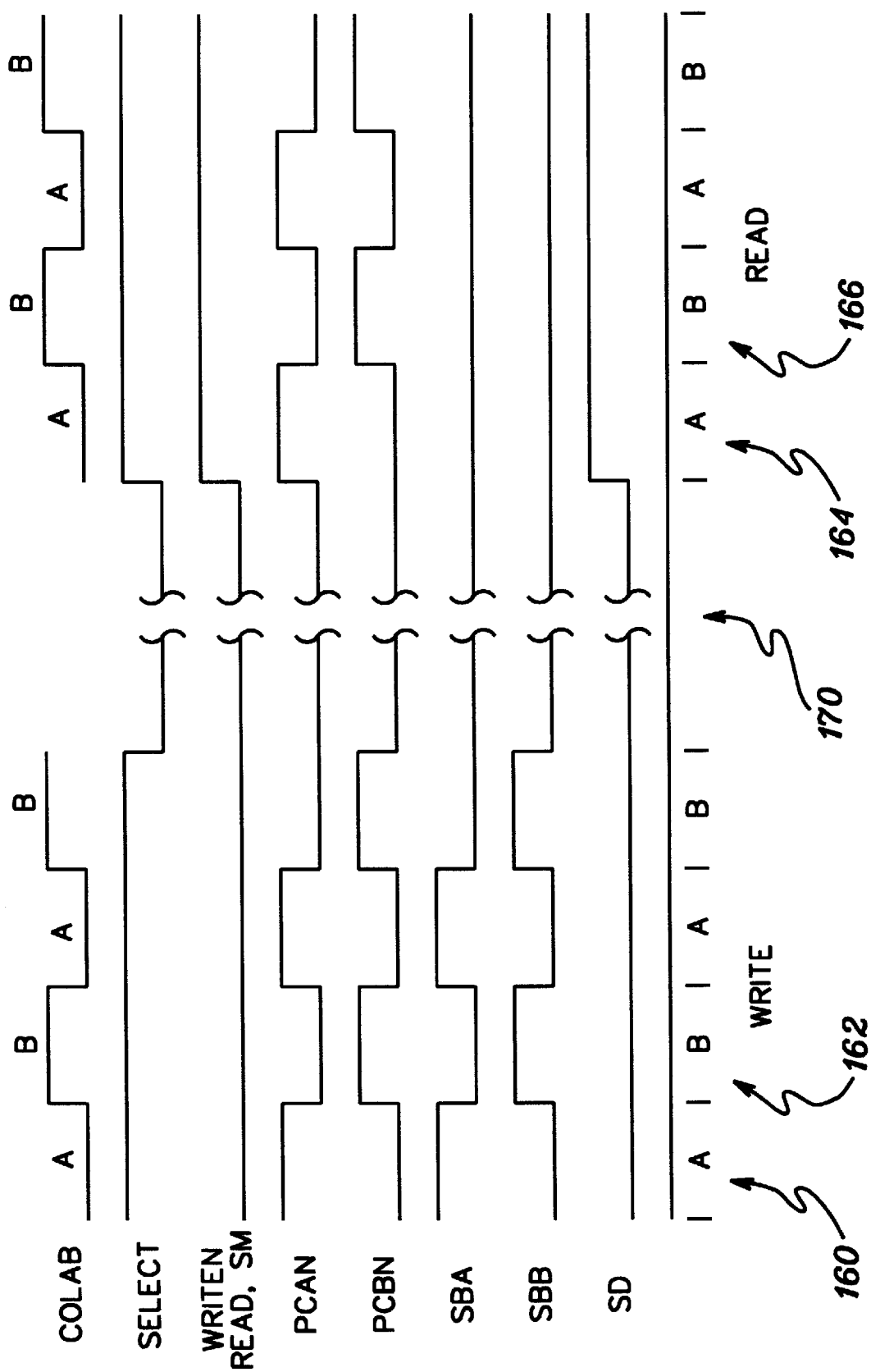

METHODS AND SYSTEMS FOR IMPROVING MEMORY COMPONENT SIZE AND ACCESS SPEED INCLUDING SPLITTING BIT LINES AND ALTERNATE PRE-CHARGE/ACCESS CYCLES

RELATED APPLICATION INFORMATION

This application relates to commonly owned concurrently or previously filed U.S. patent applications:

1. Ser. No.: 08/460,481, Docket No.: BU9-95-019, entitled "PROGRAMMABLE LOGIC CELL;"
2. Ser. No.: 08/459,156, Docket No.: BU9-95-024, entitled "PROGRAMMABLE ARRAY CLOCK/RESET RESOURCE;"
3. Ser. No.: 08/460,420, Docket No.: BU9-95-023, entitled "PROGRAMMABLE ARRAY I/O-ROUTING RESOURCE;"
4. Ser. No.: 08/459,579, Docket No.: BU9-95-025, entitled "PROGRAMMABLE ARRAY INTERCONNECT NETWORK;" and
5. Ser. No.: 08/488,314, Docket No.: BU9-95-022, entitled "CONTINUOUS ADDRESS STRUCTURE WITH FOLDING FOR A PROGRAMMABLE GATE ARRAY."

The section entitled "Description of the Preferred Embodiment(s)," and the drawings, from each of the above-referenced related U.S. patent applications are hereby expressly incorporated herein by reference.

TECHNICAL FIELD

This invention relates to semiconductor memory systems and, in particular, to semiconductor memory systems wherein component size and access speed are important design considerations as in memory systems for controlling programmable resources in a programmable array.

BACKGROUND OF THE INVENTION

The arrangement of memory cells in a memory array is widely known, as are methods and systems for accessing individual memory cells for read or write operations. Typically, a network of intersecting bit lines and word lines is provided. A memory cell is located at each intersection of the bit and word lines so that each memory cell can be uniquely accessed using its respective two-dimensional bit and word line (i.e., X-Y) address. A set of linear addresses can be decoded (by a standard decode system) into the respective two-dimensional bit and word line addresses in order to facilitate addressing and access to the memory cell array.

In a read operation for a selected cell, the respective word line is asserted, and all of the memory cells connected along the word line apply, to their respective bit lines, a voltage level corresponding to their programmed state. An appropriate read circuit, selected by the address decode system, senses the level on only one of these bit lines, i.e., the one corresponding to the selected memory cell, and the state of the cell is thereby read. The memory cell is therefore required to drive the entire bit line to provide the required voltage to the read circuit.

Depending on the speed requirements of the system, and the size or length of the bit lines (which is related to the stray capacitive effects of the bit line), it may be necessary to increase the drive capability and therefore the size of each memory cell. This is usually not a desirable design alternative. In programmable gate arrays, in which a memory system controls the programmable resources therein, the size of the memory cells is a particularly serious design consideration, since the number of programmable resources requiring memory control is high, but the amount of space proportionally allocated to the memory system as a whole is limited. In addition, if the memory cells are distributed throughout the programmable gate array, proximate their respective controlled resources, the bit line lengths must be increased to accommodate this distribution.

In a write operation to a selected memory cell, the respective word line is asserted, and a voltage level is placed on the bit line corresponding to the selected memory cell by a write circuit. The cell is thereby programmed into a state corresponding to this voltage level. The write circuit must therefore drive the entire bit line and again, the speed requirements of the system together with the stray capacitive effects of long bit lines may result in increased drive and size requirements for the write circuits.

In addition to the size of the drive circuits in the cells and the write circuits, memory designs, particularly those for programmable arrays, are constrained by other factors. Programmable gate array memory is usually loaded to configure the array at power-up in a series of closely spaced access cycles, and remains static for long periods of time thereafter. A programmable gate array, or portions thereof, may also be dynamically re-configured following the initial array configuration. Programmable gate arrays are often employed as dedicated resources in a larger system, and the performance of the system may be adversely impacted by unreasonably long programmable array configuration times. It is thus desirable to optimize, to the greatest extent possible, the speed with which memory loading is accomplished.

Further, the loading is often accomplished from an external, linearly-addressed device (e.g., an EPROM or EEPROM). To maintain a standard linear to X-Y addressing conversion scheme, segments of the bit lines should remain logically equivalent, thus decreasing the amount of circuitry required to manage multiple bit lines.

What is needed, therefore, is a memory access system and method whereby the stray capacitive effects of bit lines is reduced, thereby reducing the line drive requirements. Further, techniques are required which optimize the access time (e.g., for programmable array configuration). Finally, the bit lines should remain logically equivalent to maintain a standard X-Y addressing scheme.

SUMMARY OF THE INVENTION

Briefly summarized, the invention, in one aspect, comprises a semiconductor memory system including a first plurality of memory cells having a first conductor connected thereto, and a second plurality of memory cells having a second conductor connected thereto. The first and second conductors correspond to a first logical bit line (A), and a write data node common to the first and second conductors is provided wherein a common voltage level is applied from the write data node to the first and second conductors to write a data bit to a selected memory cell of the first and second pluralities of memory cells. The write data node may comprise a read-write data node, and the memory system may include a pre-charge voltage source selectively connectable to the first and second conductors for applying a pre-charge voltage level thereto before an access thereto, and a sense circuit having inputs connected to the first and second conductors and an output for the read-write data node. The state of a selected memory cell of the first and second pluralities of memory cells can therefore be determined by the sense circuit during a read access based upon the pre-charge voltage level.

The memory system may further include a first programmable element connected between the first conductor and the read-write data node for selectively isolating the first conductor from the read-write data node, and a second programmable element connected between the second conductor and the read-write data node for selectively isolating the second conductor from the read-write data node.

The memory system may also include a programmable multiplexer having a first input connected to the output of the sense circuit and a second input connected to the read-write data node. The multiplexer has an output connected to a common node, the common node being between the first and second programmable elements and the read-write data node. A third programmable element may be provided and connected between the common node and the read-write data node. During a write access, the multiplexer propagates a signal from the read-write data node therethrough, the first and second programmable elements are programmed to conduct, and a third programmable element is programmed not to conduct thereby providing a data bit to the first and second conductors. During a read access, the multiplexer propagates a signal from the sense circuit therethrough, the first and second programmable elements are programmed not to conduct, and the third programmable element is programmed to conduct thereby providing the sensed state of the selected memory cell of the first and second pluralities of memory cells to the read-write data node.

The memory system may further include a third plurality of memory cells having a third conductor connected thereto and a fourth plurality of memory cells having a fourth conductor connected thereto, the third and fourth conductors corresponding to a second logical bit line (B). In this case, the read-write data node is common to the first, second, third and fourth conductors and a common voltage level is simultaneously applied from the read-write data node to either the first and second conductors to write a data bit thereto or the third and fourth conductors to write a data bit thereto. The pre-charge voltage source is also selectively connectable to the third and fourth conductors for applying a pre-charge voltage level thereto. The sense circuit has inputs connected to the third and fourth conductors such that the state of a selected memory cell of the first and second pluralities of memory cells can be determined by the sense circuit during the read access based upon a pre-charge voltage level applied to the first and second conductors before the read access and to the third and fourth conductors during the read access.

The memory system may be used in a programmable array in which case the first and second pluralities of memory cells may comprise SRAM cells.

In another aspect of the invention, a memory system is provided including a first plurality of memory cells having at least one first bit line (A) connected thereto, and a second plurality of memory cells having at least one second bit line (B) connected thereto. A voltage source is provided and is selectively connectable to the at least one first bit line and the at least one second bit line for applying a predetermined voltage level thereto. A sense circuit is also provided having inputs connected to the at least one first bit line and the at least one second bit line such that the state of a selected memory cell of the second/first plurality of memory cells can be sensed by the sense circuit during a read cycle while the predetermined voltage level is applied to the at least one first/second bit line.

The semiconductor memory system may include a sense circuit chosen from one of a NAND, AND, NOR or OR circuit.

The semiconductor memory system may also include an auxiliary input to the sense circuit for forcing the sense circuit to a predetermined state. In this case, an addressing system is connected to the auxiliary input wherein for at least one first predetermined address, the auxiliary input of the sense circuit is asserted/de-asserted, and for at least one second predetermined address, the auxiliary input is de-asserted/asserted.

In yet another aspect of the invention, a semiconductor memory system is provided including a bit line having a plurality of addressable memory locations associated therewith. A sense circuit having a first input connected to the bit line is provided such that the state of a selected memory cell at a first selected memory location of the plurality of memory locations can be sensed by the sense circuit. The sense circuit has a second input for forcing the sense circuit to a predetermined state for a second selected memory location of the plurality of memory locations. In this situation, a memory cell may not be located at the second selected memory location. If the memory system is employed in a programmable array, the programmable array may not have a programmable resource associated with the second selected memory location.

In still another aspect of the invention, a method (and accompanying system) for decreasing the access time to memory cells of first and second pluralities of memory cells includes the steps of pre-charging a first bit line with a first predetermined voltage level, thereafter pre-charging a second bit line with the first predetermined voltage level, and simultaneous with the second pre-charging step, accessing the selected memory cell of the first plurality of memory cells. The accessing step may comprise a read step including comparing the voltages on the first and second bit lines for the presence or absence of the first predetermined voltage level thereby reading the state of the selected memory cell.

The first predetermined voltage level may comprise a substantially non-ground voltage level and the first and second pluralities of memory cells may be programmable into a first or second state. The step of reading includes, for one of the first and second states, the step of discharging the first predetermined voltage level from the first bit line in the selected memory cell. In this situation, the step of comparing includes the step of NANDing or ANDing signal levels on the first and second bit lines. If the predetermined voltage level is a substantially ground voltage level, the comparing step includes NORing or ORing signal levels on the first and second bit lines.

The method may further include, simultaneous with the first pre-charging step, accessing a selected memory cell of the second plurality of memory cells. These simultaneous pre-charge and access steps can be sequentially repeated for a plurality of sequential memory accesses to the first and second pluralities of memory cells thereby providing multiple substantially interleaved access and pre-charged cycle times for the first and second pluralities of memory cells.

By providing the methods and systems disclosed herein, stray capacitance of otherwise long bit lines is reduced. This is accomplished without requiring additional decode circuitry for additional logical bit lines. Further, by providing pre-charge cycles for each conductor prior to memory accesses, the need for bit line drive capability within each memory cell is eliminated. The fully interleaved pre-charge/access cycles significantly reduce the access time associated with multiple sequential memory accesses. Each of these features is particularly important for memory systems which control programmable resources in programmable arrays.

BRIEF DESCRIPTION OF THE DRAWINGS

This subject matter which is regarded as the invention is particularly pointed out and distinctly claimed in the concluding portion of the specification. The invention, however, both as to organization and method of practice, together with further aspects and advantages thereof, may best be understood by reference to the following description of a preferred embodiment and the accompanying drawings in which:

FIG. 5 is a timing diagram illustrating the timing relationships between the pre-charge and access cycles of the logical bit lines in accordance with the principles of the present invention;

DESCRIPTION OF THE PREFERRED EMBODIMENT(S)

Figure 1:
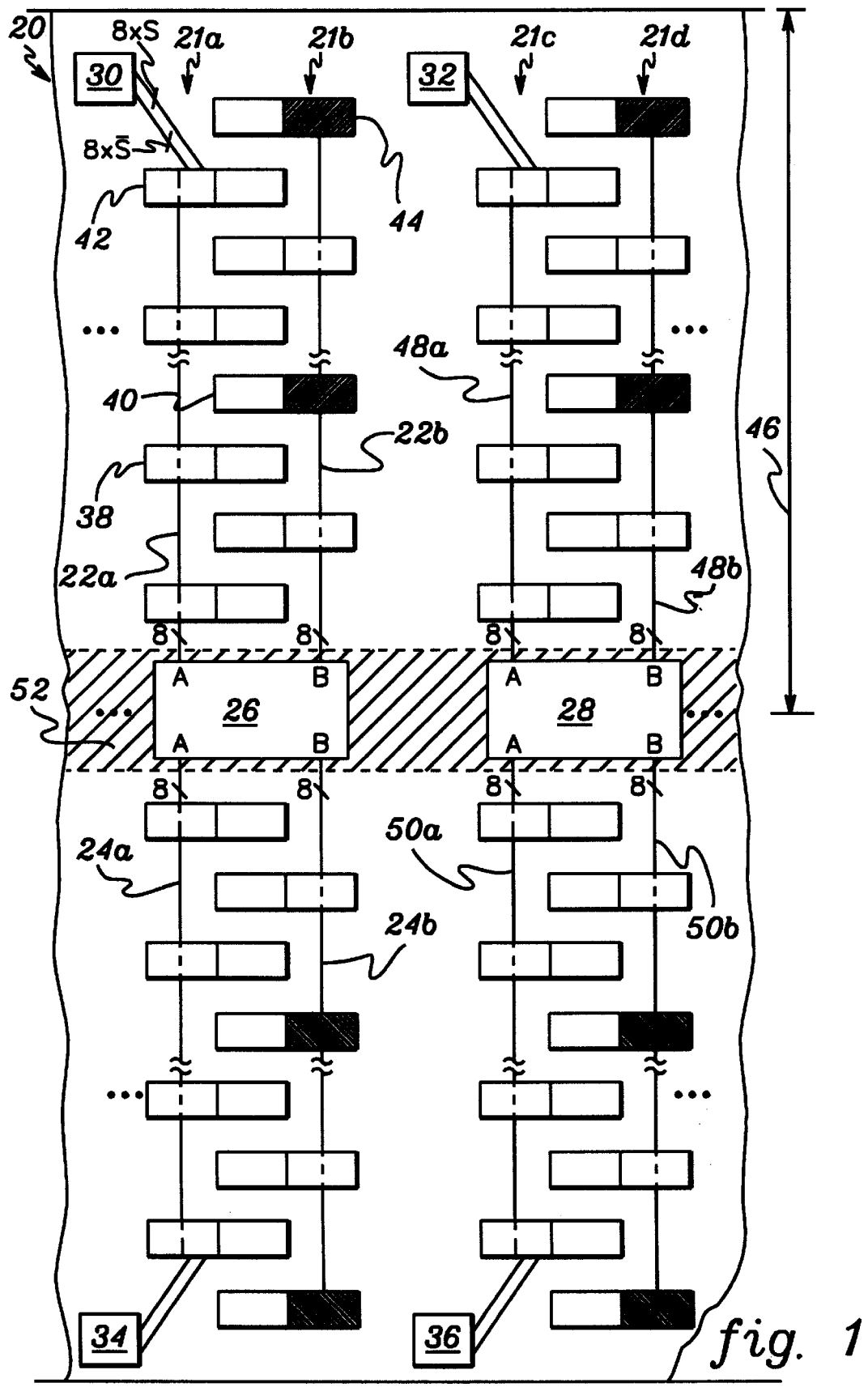
FIG. 1 depicts a longitudinal section of an integrated circuit including four columns of memory blocks, the bit lines associated with each column of memory blocks being split according to the principles of the present invention.

With reference to FIG. 1, depicted therein is a longitudinal section 20 of an integrated circuit device. Shown therein are four columns of memory cell blocks 21a–d. Pursuant to the principles of the present invention, core circuits 26 and 28 are centrally located in the longitudinal section in a central region 52 thereof. The placement of these circuits effectively divides in half the bit lines associated with each column of memory cell blocks. The blocks depicted, e.g., blocks 38, 42, etc., each may include eight memory cells in this exemplary embodiment. The word lines associated with the memory blocks are standard word lines, and are not shown in FIG. 1. Circuit 26 is placed such that the eight bit lines associated with the memory cell blocks of column 21a are divided into two conductor groups, i.e., a top conductor group 22a and a bottom conductor group 24a. As discussed below, though these groups are physically separated, they together form a group of common logical bit lines referred to herein generally as the logical bit lines "A" accessed through circuit 26. Similarly, the logical bit lines in column 21b are divided by circuit 26 into two groups of conductors 22b and 24b, and these two groups of conductors together form a set of logical bit lines referred to herein as logical bit lines "B".

Core circuit 28 similarly divides the bit lines of column 21c into groups 48a and 50a, and the bit lines of column 21d into groups 48b and 50b. The core circuits can be repeated, as required, for any number of logical bit lines.

By dividing the bit lines into at least two segments or conductors, the propagation distance of any given bit line is effectively halved, and the number of devices exposed to each conductor is effectively halved. The potential propagation distance for any one of the conductors shown is therefore distance 46, rather than twice that distance if a single conductor was used to traverse the entire chip. The decreased length of the conductors and the reduced number of the devices exposed thereto decreases the stray capacitive effects and therefore increases the speed of the circuits accessing the bit lines. The decreased stray capacitance of the conductors also results in the ability to use smaller devices to drive the conductors for both read and write operations, while maintaining system speed.

Decreasing the propagation distance associated with bit lines is especially important in programmable arrays. In a programmable array, the memory cells, rather than being closely spaced in a homogeneous block, are distributed throughout an array proximate each programmable resource of the array. For example, depicted in FIG. 1 are exemplary programmable resources 30, 32, 34 and 36. It is the location of these programmable resources which determines where the memory cells must be located in a programmable array. To accommodate the particularly large distances associated with typical programmable array layouts, the memory bit lines must support cells in the outer reaches of the chip including, for example, resources at the perimeter of the chip such as resources 30, 32, 34 and 36. The present invention therefore effectively halves this otherwise long propagation distance. A variety of programmable array arrangements, and addressing schemes therefore, are disclosed in the above-incorporated U.S. Patent applications.

Those skilled in the art will recognize that a larger number of conductors per logical bit line could be provided, and that the bit lines could be arbitrarily arranged in the array. FIG. 1 depicts an exemplary top/bottom arrangement of two conductors per logical bit line.

It is important to note that while the bit line groups are divided between conductors extending from the central region toward the top of the chip and conductors extending from the central region toward the bottom of the chip, the top and bottom conductors of a single bit line should nevertheless be associated with the same common logical bit line. If this were not the case, the four groups of logical bit lines shown in FIG. 1 would be required to be accessed as eight logical bit lines. This would effectively double the amount of access and decode logic necessary. Pursuant to the principles of the present invention, the bit lines, while divided into conductors, nevertheless retain their correspondence to a single logical bit line. This is discussed in greater detail below.

Also related to memory systems in programmable arrays is the need to map, or relate, a homogeneous array of memory cells to a non-homogeneous array of programmable resources. Standard memory systems usually contain cells or cell blocks regularly arranged therethrough. In contrast, a programmable array, while having some regularity, will require different memory support in different regions of the array. Thus, some bits of memory cell blocks may go unused. For example, in FIG. 1, memory blocks 38 and 42 may consist of eight memory cells, or data bits, and the true and complement of each data bit may be routed to a programmable resource, e.g., programmable resource 30 for memory block 42. However, programmable resources (not shown) placed proximate memory blocks 40 or 44 may only require half, or some subset of the number of memory cell bits otherwise available in those blocks. It is thus desirable to eliminate from the homogeneous memory array the memory cells which are unnecessary, thereby conserving valuable chip space. The areas of potentially eliminated memory cells are represented as shaded regions in memory blocks 40 and 44. Prior art techniques left these memory cells intact and merely treated them as dummy cells in the addressing scheme, or alternatively, may have tied their nodes to known voltages. Pursuant to the principles of the present invention, these excess memory cells are, in fact, removed from the memory array thereby affording more space for programmable resources. The bit line access circuits and addressing circuitry accommodate these removed cells by providing a virtual read capability wherein the cells appear to be present or tied to a known state to the read circuitry, but have been in fact removed. This is discussed in greater detail below.

The designation "A/B," when used alone herein denotes either element A or element B. The designations "A/B" and "B/A," when used together herein denote either (1) A and B, or (2) B and A. This convention is similarly used for other terms. Thus, logical bit line A/B is accessed during the pre-charge of logical bit line B/A, as is discussed in detail below. A "connection," as used herein, and unless otherwise expressly indicated, broadly denotes either a direct, conductive connection between components, or an indirect (e.g., buffered/inverted) interface in which the information from one component is nevertheless supplied to the other component.

Figure 2:
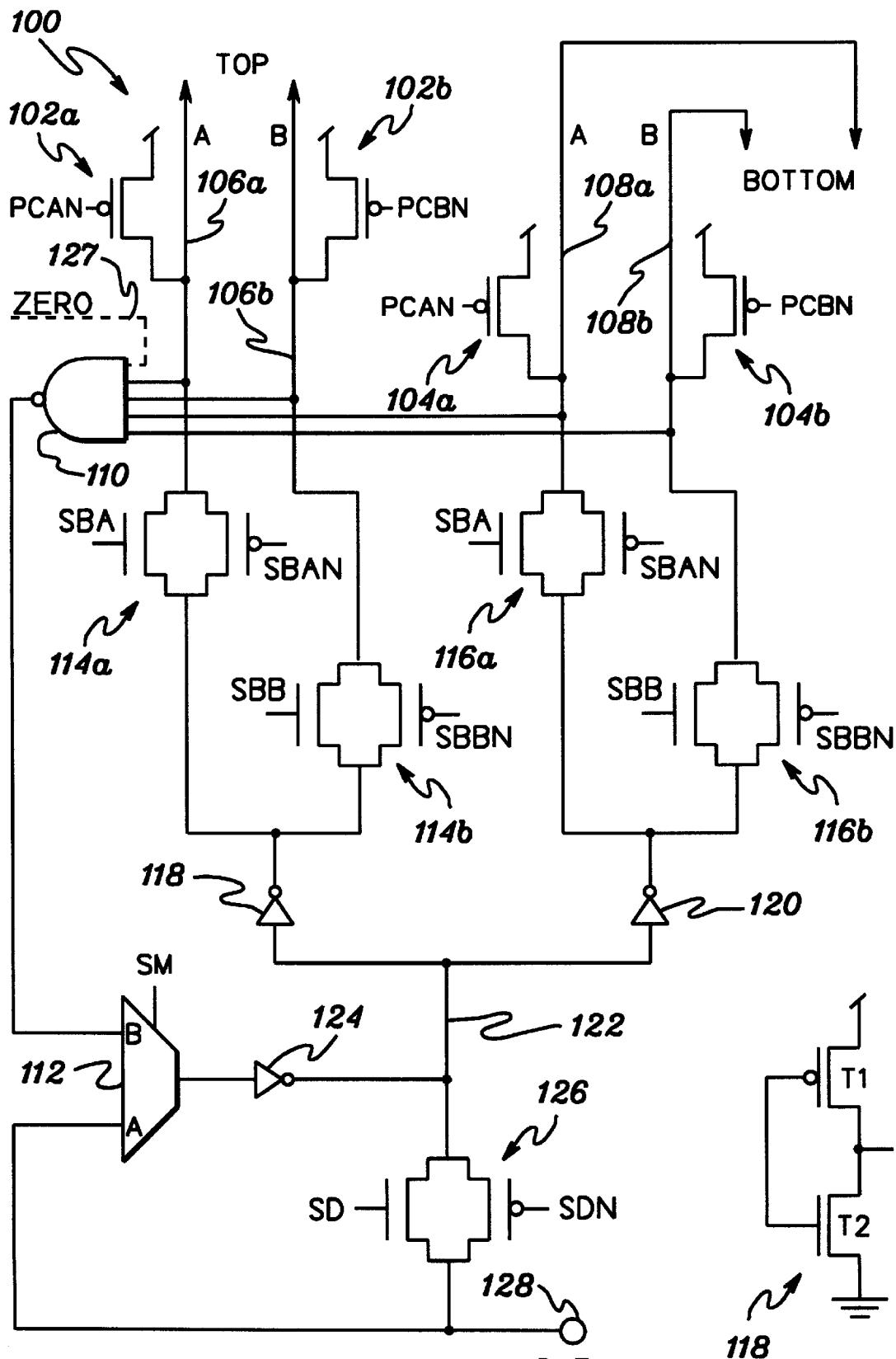
FIG. 2 depicts a bit line access circuit for two conductors of each of two logical bit lines, pursuant to the principles of the present invention.

With reference to FIG. 2, depicted therein is a bit line access circuit 100 pursuant to the principles of the present invention. Eight copies of this circuit are necessary to support the 32 conductors shown projecting from either core circuit 26 or core circuit 28 in FIG. 1. The various control signals depicted (e.g. PCAN) are discussed in detail below with respect to FIGS. 5–7. Adhering to the conventions established above, one logical bit line A includes a conductor projecting in one direction (e.g., top) and another conductor projecting in a second direction (e.g., bottom). These two conductors are designated 106a and 108a, respectively, in FIG. 2. The second logical bit line B supported by bit line access circuit 100 includes conductors 106b and 108b. Pursuant to the principles of the present invention, a single data source, i.e., read-write data node 128, is provided for both conductors of bit line A and both conductors of bit line B. For a write operation of, for example, logical bit line A, data is received at node 128 and the A port is selected through multiplexer 112. Transmission gate 126 is programmed not to conduct, and transmission gates 114a and 116a are programmed to conduct. Thus, from a single source of data 128, a write operation of both conductors 106a and 108a of logical bit line A is effected. (Transmission gates are a specific embodiment of a more general programmable element. The term "programmable element," when used herein, denotes any electrical component or device which can be dynamically configured to either propagate digital information or not. For example, a tri-state buffer may also be considered a programmable element.) Both conductors of logical bit line A, i.e., conductors 106a and 108a, are also connected to the inputs of a sense circuit 110. During a read operation, input B of the multiplexer 112 is selected thereby propagating the output of the sense circuit 110 therethrough to node 122. During a read, transmission gates 114a and 116a are programmed not to conduct and transmission gate 126 is programmed to conduct thereby providing the output of the sense circuit to read-write node 128. Node 122, because it is commonly employed during both read and write cycles, will be referred to herein as a common node. Using this bit line access circuit 100, the conductors associated with bit line A are read and written in a logically equivalent fashion, i.e., from a single node 128, but all of the advantages resulting from separate conductors, as discussed above, are realized.

Another feature of the invention, depicted in FIG. 2, involves the provision of pre-charge transistors 102a and 104a, which in a preferred embodiment are PFETS, which are controlled by active low gate signals. Before a read or write cycle to logical bit line A, a positive pre-charge voltage is applied to both conductors of the logical bit line A through transistors 102a and 104a. By providing a pre-charge voltage, the size of the memory cells and any drivers therein can be significantly reduced because instead of driving a data state along either conductor 106a or 108a to sense circuit 110, a simple discharge path can be provided in the memory cell for the pre-charge voltage placed on the bit line. During the actual access cycle, either a read or write, the pre-charge voltage is removed by closing transistors 102a and 104a.

In a preferred embodiment, sense circuit 100 is a NAND gate, and driving inverters 118, 120 and 124 are placed in the circuit to provide the proper polarities during write and read of the memory cells connected to the conductors of logical bit line A.

One skilled in the art will recognize that the principles and components necessary to support the two conductors of logical bit line A can be easily extended to support any arbitrary number of conductors of logical bit line A.

Another feature of the present invention is depicted in FIG. 2. The same bit line access circuit 100 can be extended to access another logical bit line B including conductors 106b and 108b. A similar set of programmable elements 114b and 116b is provided for access cycles to logical bit line B. Pre-charge transistors 102b and 104b are also provided therefore. In addition, both conductors of logical bit line B are applied to inputs of sense circuit 110. Thus, not only is the sense circuit shared between the conductors of logical bit line A, the same circuit can be shared by conductors of additional logical bit lines including those of logical bit line B.

In a preferred embodiment, the pre-charge voltage level discussed above is a positive voltage, or VDD (e.g., about 3.3V in CMOS5 technology). Pursuant to the principles of the present invention, the pre-charge and access cycles for logical bit line A and logical bit line B are fully interleaved so that during a read cycle to logical bit line A, the high voltage applied to logical bit line B, in anticipation of an access cycle thereto, is simultaneously applied to sense circuit 110. If sense circuit 110 is a NAND gate, as shown, the high voltages applied to conductors 106b and 108b prevent the NAND circuit from triggering or going low. Thus, while logical bit line A is being read, and logical bit line B is being pre-charged, the state of the sense circuit 110 is determined solely by the states of the conductors 106a and 108a of logical bit line A. Similarly, during an access to logical bit line B, the conductors of logical bit line A are pre-charged so that the output of the sense circuit is determined solely by the states of the conductors 106b and 108b of logical bit line B.

Those skilled in the art will recognize that, in addition to expansion of any arbitrary number of conductors per logical bit line, the circuit of FIG. 2 could be easily expanded to support any arbitrary number of logical bit lines, even though only two are shown. This would involve merely a replication of the transmission gates 114 and 116, as well as providing additional inputs into the sense circuit 110.

Those skilled in the art will also recognize that, with respect to the interleaved pre-charge and access cycles of the present invention, multiple conductors are not required to be provided for a single logical bit line. The present invention provides fully interleaved access and pre-charge cycles for separate logical bit lines without regard to the number of conductors provided per bit line.

Those skilled in the art will further recognize that if the predetermined pre-charge voltage is substantially a ground voltage, the sense circuit 110 can be implemented using a gate from the NOR/OR family. In this case, a drive capability would be necessary in the memory cell, to toggle the bit lines. In the preferred embodiments, the pre-charge voltage is non-ground, and the sense circuit is a NAND gate. The cells, to toggle the bit lines, need only provide a discharge path, which allows for a decrease in cell size.

Pursuant to the principals of the present invention, an input 127 to sense circuit 110 can be provided and connected to the word line addressing system. This input provides the virtual read capability, discussed above, for addressable memory locations for which the corresponding memory cell was eliminated (e.g., blocks 40 and 44 of FIG. 1). It will be generally known which memory locations do not have memory cells corresponding thereto, and this input can be used to trigger the sense circuit 110 to a known state whenever an access to that particular location is attempted. This is an improvement over the prior art wherein the memory cell remained in the circuit, but did not have a corresponding programmable resource connected thereto.

Figure 3:
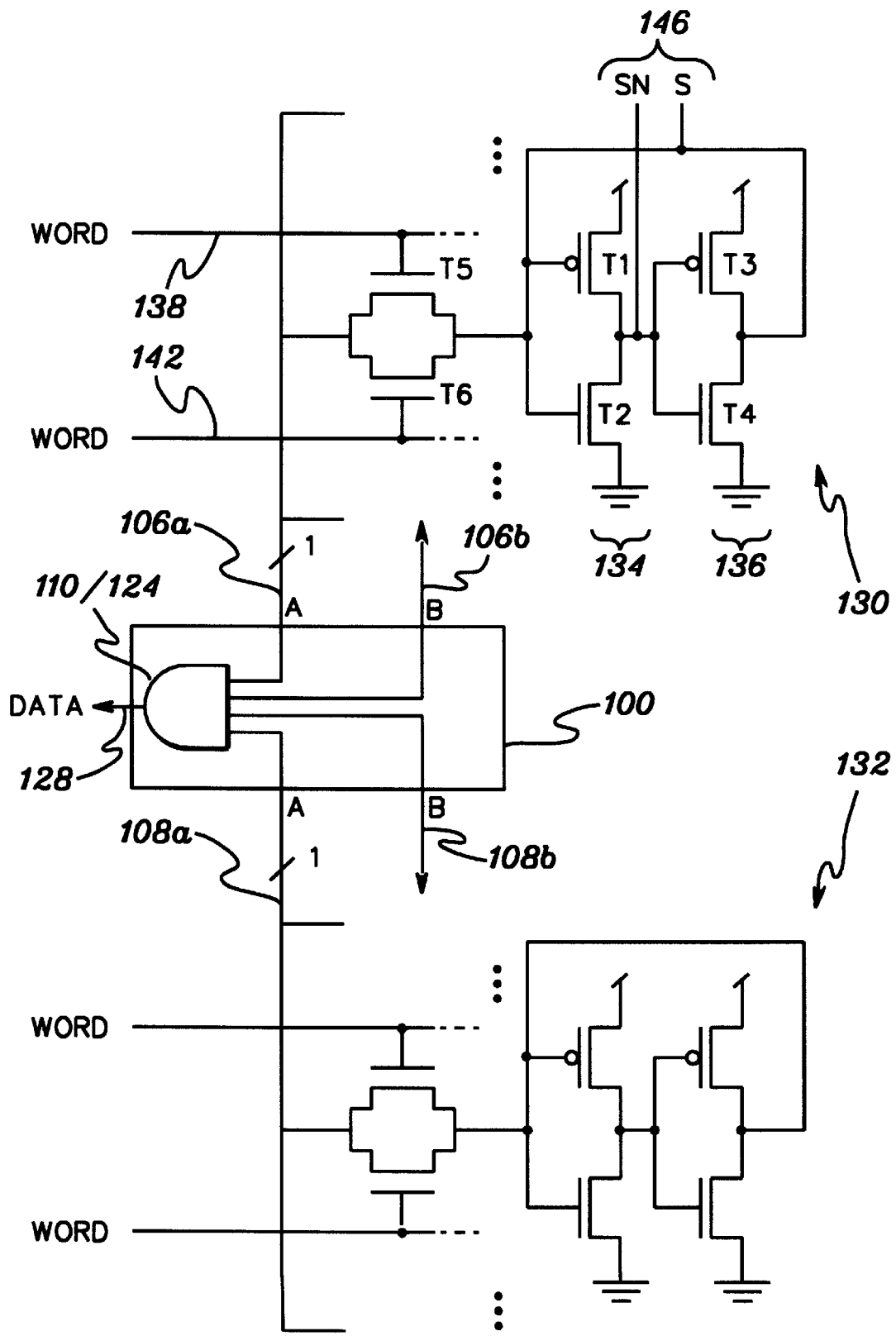
FIG. 3 depicts a simplified bit line access circuit of the present invention having upper and lower conductors connected to SRAM cells.

FIG. 3 (in which like elements are referred to using like reference numerals) depicts a simplified version of bit line access circuit 100 connected to logical bit line A conductors 106a and 108a to illustrate the bit line pre-charge operation of the present invention. Two static random access memory ("SRAM") cells are also depicted in FIG. 3. Though the embodiment depicted employs SRAM cells, other types of memory cells could be employed without departing from the principles of the present invention. Memory cell 130 is associated with upper bit line conductor 106a and memory cell 132 is associated with lower bit line conductor 108a. Memory cell 130 includes a pair of cross-coupled inverters 134 and 136 connectable to the bit line 106a through read transistor T5 and write transistor T6. Horizontal word lines 138 and 142 are part of a standard addressing system for selecting a row of memory cells. As discussed above, a word line can be used to select a row of memory cells and a bit line can be used to select a column of memory cells whereby each cell is individually or uniquely selectable in a two-dimensional, X-Y addressing system. Cell 130 is also shown having an exemplary pair of conductors 146, possibly leading from complementary nodes S and SN to a programmable resource in a programmable array.

Before a read access to the cells in the column of cells associated with logical bit line A, a pre-charge voltage is applied to both conductors 106a and 108a of logical bit line A. (Pursuant to the present invention, this pre-charge is preferably applied during the access to logical bit line B.) A discharge path can be created through read transistor T5, along node S and through transistor T4 to ground if node SN is high, i.e., transistor T4 is conducting. Therefore, if a logic low has been previously written to node S, node SN is high, resulting in transistor T4 conducting. Conductor 106a is therefore discharged, resulting in a logic low output to node 128 through the NAND/inverter combination 110/124 of circuit 100. If node S has been programmed into a high state, SN is low and no discharge path is maintained through transistor T4. Thus, conductors 106a and 108a remain high, and conductors 106b and 106b, which are simultaneously being pre-charged, are high and a logic high signal is output from the sense circuit 110/124. Because only a low level discharge path is required in the SRAM cell, rather than a full bit line drive capability, the device sizes therein can be minimized. Typical device sizes for transistors T1–T6 in an embodiment of the SRAM cell of FIG. 3 are contained in the following table:

|  | T1 | T2 | T3 | T4 | T5 | T6 |
|---|---|---|---|---|---|---|
| Length | 700 nm | 700 nm | 700 nm | 700 nm | 700 nm | 700 nm |
| Width | .7 $\mu$m | 1.5 $\mu$m | .7 $\mu$m | 1.5 $\mu$m | 1.5 $\mu$m | 3.25 $\mu$m |

In the exemplary embodiment of FIG. 3, each conductor spans approximately one-half the distance of a chip, or about 6.35 mm for a programmable array implementation.

Figure 4:
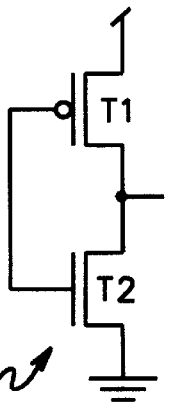
FIG. 4 depicts a driving inverter implemented in the bit line access circuit of the present invention.

In contrast to the small device sizes employed for discharging the bit line, FIG. 4 depicts the driving inverter 118 used in bit line access circuit 100. (Those skilled in the art will recognize that the "T" designations used for the transistors in the various schematics herein do not generally designate the same transistors if they are repetitively used in separate schematics.) Transistor T1 from inverter 118 (and similarly formed inverter 120) has a device width of 38 $\mu$m and device length of 700 nm. Transistor T2 has a device width of 24 $\mu$m and a device length of 700 nm. These devices are significantly larger than the drivers in the SRAM cells because they are required to drive the entire bit line conductor during a write operation. The interleaved pre-charging of the present invention is also employed during write operations. The pre-charge remaining on a bit line conductor will help improve speed during a write, and also allows the PFET T1 to be of a slightly lower size than would otherwise be necessary.

FIG. 5 is a timing diagram of the control signals of bit line access circuit 100 depicted in FIGS. 2 and 3, and clearly illustrates the interleaved pre-charge and access cycles of the present invention. The first three signals COLAB, SELECT, and WRITEN-READ-SM are discussed further below but are generally higher level control signals derived from standard address decode logic. The control signals that specifically apply to the bit line access circuits of the present invention include the pre-charge signals PCAN and PCBN which are active low, SBA and SBB (the complements SBAN and SBBN are not shown) and the control signal SD (again the complement of this signal is not shown). The left region of FIG. 5 depicts multiple sequential write operations. The right region of FIG. 5 depicts multiple sequential read operations. During a write operation, SD is low (thereby programming transmission gate 126 not to conduct) and SM is low (thereby selecting the path through multiplexer 112 corresponding to read-write data node 128). Time period 160 represents the period in which logical bit line A is being written, i.e., transmission gates 114a and 116a are programmed to conduct by a high level signal on control line SBA, and the pre-charge transistors are turned off by a high level signal on control line PCAN. During this time period, the control signals PCBN are low indicating a pre-charge is occurring on the conductors corresponding to logical bit line B.

During the next time period 162, the pattern is reversed. The control lines PCAN become low thereby applying a pre-charge voltage to bit line A and the write to logical bit line B is accomplished with a high control line SBB thereby programming transmission gates 114b and 116b to conduct. This interleaved cycle is repeated two more times in this exemplary series of sequential write cycles. Note that during time period 170 in which neither a read nor write is being performed, the pre-charge control transistors are turned on by applying a low signal to the control lines PCAN and PCBN. Thus, the pre-charge lines are held high during periods of no memory access. During the sequence of read cycles beginning with time period 164, the transmission gates 114a, 114b, 116a and 116b are all turned off by low levels on the control lines SBA and SBB. The sense circuit output is selected through multiplexer 112 by a high control signal SM and transmission gate 126 is turned on with control signal SD. The pre-charge/access signals continue to alternate for adjacent read cycles 166, etc.

The fully interleaved pre-charge and access cycles significantly decrease the time required to perform multiple, sequential memory accesses. As discussed above, this is particularly important in programmable arrays where configuration speed is important. However, the principles of the present invention are generally applicable to any general memory array in which pre-charging may be employed.

Figure 6:
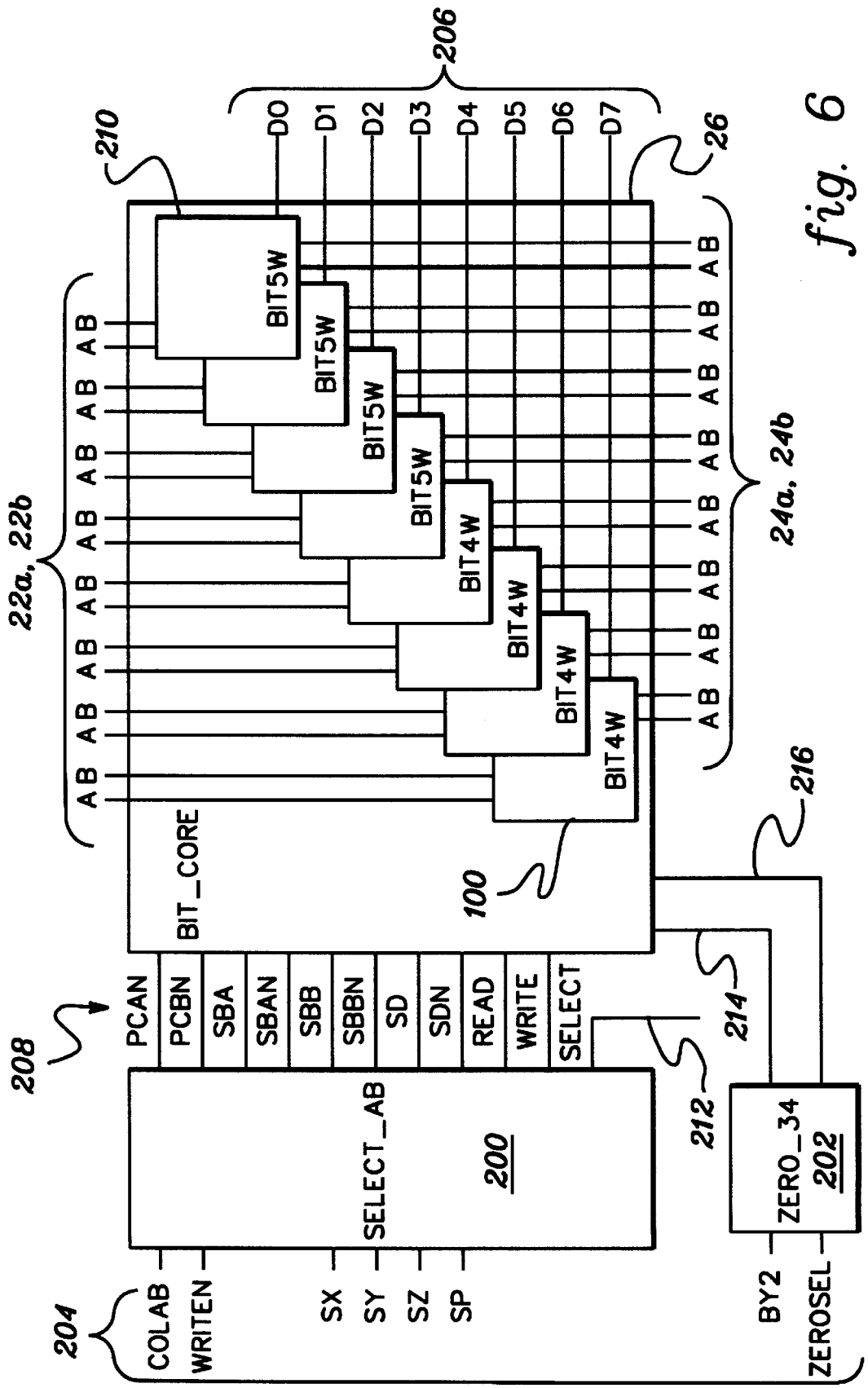
FIG. 6 depicts an arrangement of circuits employed to control four conductor groups of two eight-bit logical bit lines in accordance with the principles of the present invention.

FIG. 6 depicts an exemplary arrangement of bit line access circuits and decode logic employed in a current embodiment of the present invention. Core circuit 26, as discussed above with respect to FIG. 1, supports four groups of eight bit line conductors comprising two logical bit line groups A and B. As discussed above regarding FIG. 1, conductor groups 22a and 22b project toward the upper region of the longitudinal section and conductor groups 24a and 24b project toward the lower region of the longitudinal section. In the exemplary embodiment of FIG. 6, eight bit line access circuits are provided in core 26, each supporting four individual conductors equally split between the two logical bit lines A and B. However, in this exemplary embodiment, four of the bit line access circuits (labeled BIT5W, e.g., 210) include the ground state or virtual read capability indicating that four bits of at least one of the bytes being accessed by core 26 are actually not employed in certain regions of the memory column. The remaining four bit line access circuits (labeled BIT4W, e.g., 100) do not employ this auxiliary input.

Data lines 206 (D0–D7) are respectively applied to the eight bit line access circuits from a common data bus. Control signals signal comprising a control signal set discussed in detail above, are applied to each of the eight bit line access circuits within core 26 (the actual connections are not shown for clarity). Address lines 204, derived from any standard word line addressing system, are decoded through circuits 200 and 202 to provide the proper mix and polarity of control signals 208. Line 212 is merely an auxiliary column select output signal. Circuit 202 produces zero or ground state signals 214 and 216 which are selectively applied to one of the four BIT5W circuits employing the virtual read capability of the present invention. Assuming an eight-bit data bus is employed, one copy of the circuitry disclosed in FIG. 6 is employed for each column of memory bytes in the subject memory array.

Figure 7:
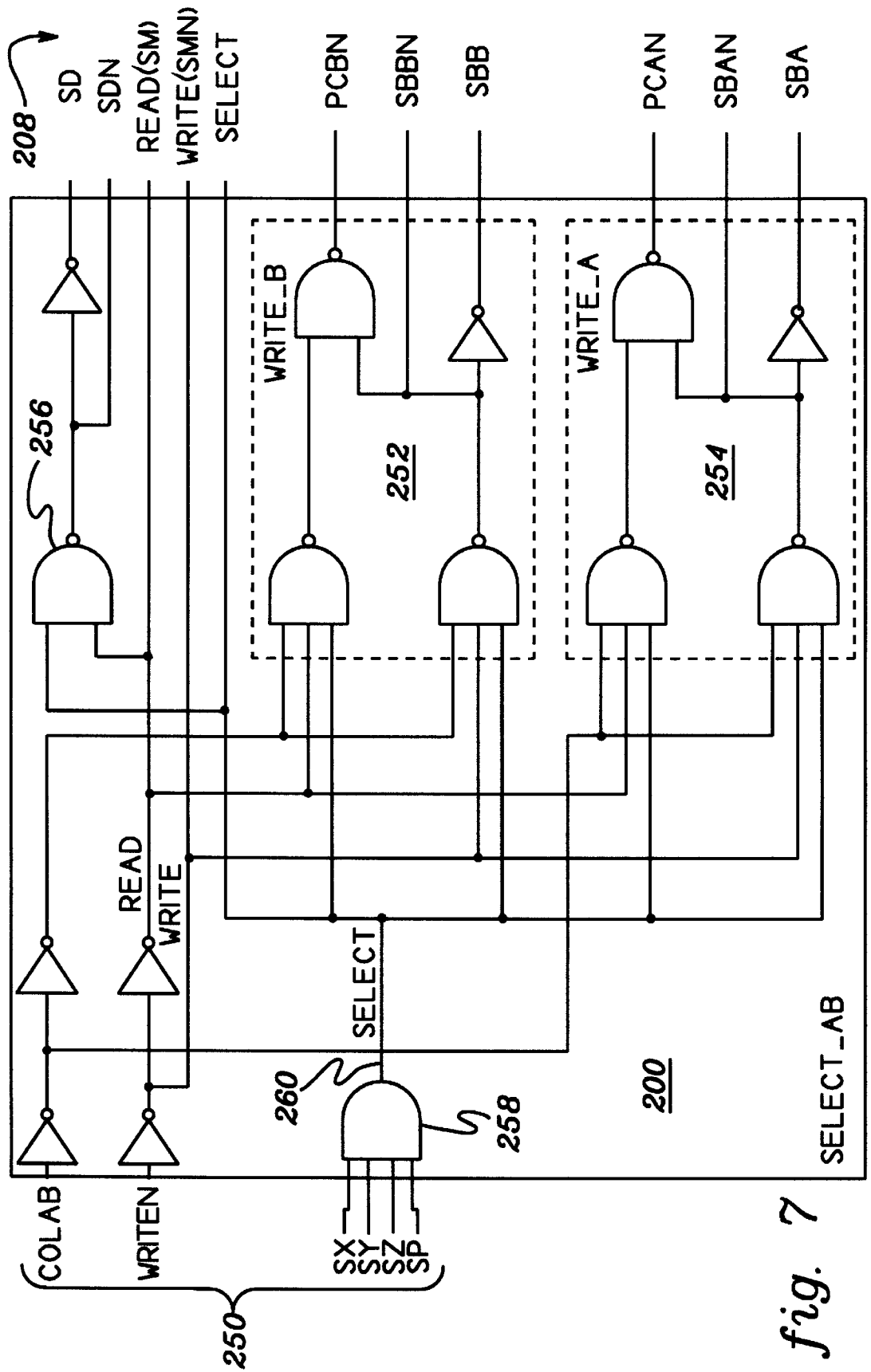
FIG. 7 depicts a decode circuit which accepts standard addressing inputs and which produces the control signals necessary to operate the bit line access circuit of the present invention.

Circuit 200 is depicted in detail in FIG. 7 (in which like elements are referred to using like reference numerals). Shown therein is a subset 250 of the address signals 204 which produce the set of control signals 208. The true and complement of the COLAB signal is used to alternatively activate either write circuit 252 or write circuit 254 which correspond respectively to logical bit line B and logical bit line A. The true and complement of the WRITEN signal (i.e., read and write, respectively) are employed to activate the SM and SMN signals to control the multiplexers 112 of the eight bit line access circuits, as well as the SD signal which controls the transmission gates 126. The SELECT signal 260 (which is activated by AND gate 258 and the proper combination of addressing SX, SY, SZ and SP) activates all of the outputs including the SD outputs through NAND gate 256 as well as the write circuits 252 and 254 through the respective NAND gates depicted therein.

One skilled in the art will recognize that the decode logic of circuit 200 results in the properly timed control signals 208, resultant from the input addressing signals 250. The specific relationship between these signals is depicted in the timing diagram of FIG. 5.

The present invention, by providing multiple conductors per logical bit line, and by maintaining logical equivalence between the multiple conductors, reduces the stray capacitance of the otherwise long bit lines. This is accomplished without requiring additional decode circuitry for additional logical bit lines. This is particularly important for programmable gate arrays having programming memory cells distributed throughout proximate respective programmable resources, because of the potentially long bit lines therein.

Further, by providing pre-charge cycles for each conductor prior to memory accesses, the need for bit line drive capability within each memory cell is eliminated, thus significantly decreasing the size of each memory cell. Finally, the fully interleaved pre-charge/access cycles of the present invention significantly reduce the access time associated with multiple, sequential access cycles to memory cells connected to two or more logical bit lines, which is again an important design consideration for programmable gate arrays.

The unique bit line access circuit of the present invention supports multiple conductors per logical bit line and the interleaved pre-charge/access cycles thereby providing these desirable results.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

We claim:

1. A semiconductor memory system comprising:

a first plurality of memory cells having a first conductor connected thereto;

a second plurality of memory cells having a second conductor connected thereto, the first and second conductors corresponding to a first logical bit line (A);

a read-write data node common to the first and second conductors wherein a common voltage level is applied from the read-write data node to the first and second conductors to write a data bit to a selected memory cell of the first and second pluralities of memory cells;

a pre-charge voltage source selectively connectable to the first and second conductors for applying a pre-charge voltage level thereto before an access thereto; and a sense circuit having inputs connected to the first and second conductors and an output for the read-write data node such that the state of a selected memory cell of the first and second pluralities of memory cells can be determined by the sense circuit during a read access based upon the pre-charge voltage level;

wherein the sense circuit comprises one gate of the group of gates consisting of a NAND, AND, NOR and OR.

2. A semiconductor memory system comprising:

a first plurality of memory cells having a first conductor connected thereto;

a second plurality of memory cells having a second conductor connected thereto, the first and second conductors corresponding to a first logical bit line (A);

a read-write data node common to the first and second conductors wherein a common voltage level is applied from the read-write data node to the first and second conductors to write a data bit to a selected memory cell of the first and second pluralities of memory cells;

a pre-charge voltage source selectively connectable to the first and second conductors for applying a pre-charge voltage level thereto before an access thereto; and a sense circuit having inputs connected to the first and second conductors and an output for the read-write data node such that the state of a selected memory cell of the first and second pluralities of memory cells can be determined by the sense circuit during a read access based upon the pre-charge voltage level;

wherein the pre-charge voltage level comprises a substantially non-ground voltage level and wherein the first and second pluralities of memory cells are programmable into a first or second state, one of the first and second states providing, upon cell selection during the read access, a discharge path for the pre-charge voltage level resident on the respective first or second conductor; and wherein the sense circuit comprises a NAND gate or an AND gate.

3. A semiconductor memory system comprising:

a first plurality of memory cells having a first conductor connected thereto;

a second plurality of memory cells having a second conductor connected thereto, the first and second conductors corresponding to a first logical bit line (A);

a read-write data node common to the first and second conductors wherein a common voltage level is applied from the read-write data node to the first and second conductors to write a data bit to a selected memory cell of the first and second pluralities of memory cells;

a pre-charge voltage source selectively connectable to the first and second conductors for applying a pre-charge voltage level thereto before an access thereto; and a sense circuit having inputs connected to the first and second conductors and an output for the read-write data node such that the state of a selected memory cell of the first and second pluralities of memory cells can be determined by the sense circuit during a read access based upon the pre-charge voltage level;

wherein the pre-charge voltage level comprises a substantially ground voltage level and wherein the first and second pluralities of memory cells are programmable into a first or second state, one of the first and second states providing, upon cell selection during the read access, a read voltage level on the respective first or second conductor; and wherein the sense circuit comprises a NOR gate or an OR gate.

4. A semiconductor memory system comprising:

a first plurality of memory cells having a first conductor connected thereto;

a second plurality of memory cells having a second conductor connected thereto, the first and second conductors corresponding to a first logical bit line (A);

a read-write data node common to the first and second conductors wherein a common voltage level is applied from the read-write data node to the first and second conductors to write a data bit to a selected memory cell of the first and second pluralities of memory cells;

a pre-charge voltage source selectively connectable to the first and second conductors for applying a pre-charge voltage level thereto before an access thereto;

a sense circuit having inputs connected to the first and second conductors and an output for the read-write data node such that the state of a selected memory cell of the first and second pluralities of memory cells can be determined by the sense circuit during a read access based upon the pre-charge voltage level;

a third plurality of memory cells having a third conductor connected thereto; and a fourth plurality of memory cells having a fourth conductor connected thereto, the third and fourth conductors corresponding to a second logical bit line (B), wherein:

the read-write data node is common to the first, second, third and fourth conductors and wherein the common voltage level is simultaneously applied from the read-write data node to either the first and second conductors to write a data bit to a selected memory cell of the first and second pluralities of memory cells, or the third and fourth conductors to write a data bit to a selected memory cell of the third and fourth pluralities of memory cells, and the pre-charge voltage source is selectively connectable to the third and fourth conductors for applying a pre-charge voltage level thereto.

5. The semiconductor memory system of claim 4 wherein:

the sense circuit has inputs connected to the third and fourth conductors such that the state of a selected memory cell of the first and second pluralities of memory cells can be determined by the sense circuit during the read access based upon a pre-charge voltage level applied to the first and second conductors before the read access and to the third and fourth conductors during the read access.

6. A semiconductor memory system comprising:

a first plurality of memory cells having a first conductor connected thereto;

a second plurality of memory cells having a second conductor connected thereto, the first and second conductors corresponding to a first logical bit line (A);

a read-write data node common to the first and second conductors wherein a common voltage level is applied from the read-write data node to the first and second conductors to write a data bit to a selected memory cell of the first and second pluralities of memory cells;

a pre-charge voltage source selectively connectable to the first and second conductors for applying a pre-charge voltage level thereto before an access thereto;

a sense circuit having inputs connected to the first and second conductors and an output for the read-write data node such that the state of a selected memory cell of the first and second pluralities of memory cells can be determined by the sense circuit during a read access based upon the pre-charge voltage level;

a first programmable element connected between the first conductor and the read-write data node for selectively isolating the first conductor from the read-write data node;

a second programmable element connected between the second conductor and the read-write data node for selectively isolating the second conductor from the read-write data node;

a programmable multiplexer having a first input connected to the output of the sense circuit and a second input connected to the read-write data node, the multiplexer further having an output connected to a common node, the common node being between the first and second programmable elements and the read-write data node; and a third programmable element connected between the common node and the read-write data node wherein:

during a write access, the multiplexer propagates a signal from the read-write data node therethrough, the first and second programmable elements are programmed to conduct, and the third programmable element is programmed not to conduct thereby providing a data bit to the first and second conductors, and during the read access, the multiplexer propagates a signal from the sense circuit therethrough, the first and second programmable elements are programmed not to conduct, and the third programmable element is programmed to conduct thereby providing the sensed state of the selected memory cell of the first and second pluralities of memory cells to the read-write data node.

7. The semiconductor memory system of claim 6, further comprising:

a first buffer/inverter connected between the output of the programmable multiplexer and the common node; and at least one second buffer/inverter connected between the common node and the first and second programmable elements.

8. The semiconductor memory system of claim 7 wherein the at least one second buffer/inverter comprises two buffers/inverters, a first one of the two buffers/inverters connected between the first programmable element and the common node, the second one of the two buffers/inverters connected between the second programmable element and the common node.

9. A semiconductor memory system comprising:

a first plurality of memory cells having a first conductor connected thereto;

a second plurality of memory cells having a second conductor connected thereto, the first and second conductors corresponding to a first logical bit line (A); and a write data node common to the first and second conductors wherein a common voltage level is applied from the write data node to the first and second conductors to write a data bit to a selected memory cell of the first and second pluralities of memory cells, the first and second conductors remaining mutually electrically isolated while the common voltage level is applied thereto.

10. The semiconductor memory system of claim 9, wherein the write data node comprises a read-write data node, the semiconductor memory system further comprising:

a pre-charge voltage source selectively connectable to the first and second conductors for applying a pre-charge voltage level thereto before an access thereto and;

a sense circuit having inputs connected to the first and second conductors and an output for the read-write data node such that the state of a selected memory cell of the first and second pluralities of memory cells can be determined by the sense circuit during a read access based upon the pre-charge voltage level.

11. The semiconductor memory system of claim 10, further comprising:

a first programmable element connected between the first conductor and the read-write data node for selectively isolating the first conductor from the read-write data node; and a second programmable element connected between the second conductor and the read-write data node for selectively isolating the second conductor from the read-write data node.

12. The semiconductor memory system of claim 10 wherein the pre-charge voltage level comprises a substantially non-ground voltage level and wherein the first and second pluralities of memory cells are programmable into a first or second state, one of the first and second states providing, upon cell selection during the read access, a discharge path for the pre-charge voltage level resident on the respective first or second conductor.

13. The semiconductor memory system of claim 10 wherein the pre-charge voltage level comprises a substantially ground voltage level and wherein the first and second pluralities of memory cells are programmable into a first or second state, one of the first and second states providing, upon cell selection during the read access, a read voltage level on the respective first or second conductor.

14. A programmable array having a plurality of programmable resources, the plurality of programmable resources being controlled by a semiconductor memory system comprising:

a first plurality of memory cells having a first conductor connected thereto;

a second plurality of memory cells having a second conductor connected thereto, the first and second conductors corresponding to a first logical bit line (A);

a write data node common to the first and second conductors wherein a common voltage level is applied from the write data node to the first and second conductors to write a data bit to a selected memory cell of the first and second pluralities of memory cells.

15. The programmable array of claim 14 wherein the first and second pluralities of memory cells comprise SRAM cells.

16. A semiconductor memory system comprising:

at least one bit line having a plurality of addressable memory locations associated therewith; and a sense circuit having at least one bit line input connected to the at least one bit line such that the state of a selected memory cell at a first selected memory location of the plurality of memory locations can be sensed by the sense circuit, the sense circuit having a forcing input for forcing the sense circuit to a predetermined state for a second selected memory location of the plurality of memory locations.

17. The semiconductor memory system of claim 16 wherein a memory cell is not located at the second selected memory location.

18. A programmable array having a plurality of programmable resources, the plurality of programmable resources being controlled by the semiconductor memory system of claim 17, the programmable array not having a programmable resource associated with the second selected memory location.

19. A semiconductor memory system comprising:

a first plurality of memory cells having at least one first bit line (A) connected thereto;

a second plurality of memory cells having at least one second bit line (B) connected thereto;

a voltage source being selectively connectable to the at least one first bit line and the at least one second bit line for applying a predetermined voltage level thereto; and a sense circuit having inputs connected to the at least one first bit line and the at least one second bit line such that the state of a selected memory cell of the second/first plurality of memory cells can be sensed by said sense circuit during a read cycle while the predetermined voltage level is applied to the at least one first/second bit line.

20. The semiconductor memory system of claim 19 wherein the sense circuit comprises one gate of the group of gates consisting of a NAND, AND, NOR and OR.

21. The semiconductor memory system of claim 19 wherein the predetermined voltage level comprises a substantially non-ground voltage level and wherein the first and second pluralities of memory cells are programmable into a first or second state, one of the first and second states providing, upon memory cell selection during the read cycle, a discharge path for the predetermined voltage level resident on the at least one second/first bit line.

22. The semiconductor memory system of claim 21 wherein the sense circuit comprises a NAND gate or an AND gate.

23. The semiconductor memory system of claim 14 wherein the predetermined voltage level comprises a substantially ground voltage level and wherein the first and second pluralities of memory cells are programmable into a first or second state, one of the first and second states providing, upon memory cell selection during the read cycle, a read voltage level on the at least one second/first bit line.

24. The semiconductor memory system of claim 23 wherein the sense circuit comprises a NOR gate or an OR gate.

25. A programmable array having a plurality of programmable resources, the plurality of programmable resources being controlled by the semiconductor memory system of claim 19.

26. The programmable array of claim 25 wherein the first and second pluralities of memory cells comprise SRAM cells.

27. The semiconductor memory system of claim 19, further comprising a read-write data node programmably connectable to the at least one first bit line and the at least one second bit line.

28. The semiconductor memory system of claim 27 wherein the at least one first bit line comprises two first conductors, and wherein the sense circuit has an input connected to each of the two first conductors.

29. The semiconductor memory system of claim 28 wherein the at least one second bit line comprises two second conductors, and wherein the sense circuit has an input connected to each of the two second conductors.

30. The semiconductor memory system of claim 29, further comprising:

a programmable multiplexer having a first input connected to the read-write data node and a second input connected to the output of the sense circuit, the programmable multiplexer further having an output connected to a common node;

first and second programmable elements, each being connected between the common node and a respective one of the two first conductors;

a third programmable element connected between the read-write data node and the common node;

fourth and fifth programmable elements, each being connected between the common node and a respective one of the two second conductors.

31. The semiconductor memory system of claim 30 wherein the memory cells of the first, second, third and fourth pluralities of memory cells include a discharge path from the respective bit line when programmed into a given state, and wherein the sense circuit comprises a NAND gate, the semiconductor memory system further comprising:

a first inverter having an input connected to the output of the programmable multiplexer, the first inverter further having an output connected to the common node;

a second inverter having an input connected to the common node, the second inverter further having an output connected to the first and fourth programmable elements;

a third inverter having an input connected to the common node, the third inverter further having an output connected to the second and fifth programmable elements.

32. The semiconductor memory system of claim 31 wherein the sense circuit includes an auxiliary input for forcing the sense circuit to a predetermined state.

33. The semiconductor memory system of claim 32, further comprising:

an addressing system connected to the auxiliary input, wherein for at least one first predetermined address, the auxiliary input of the sense circuit is asserted/de-asserted, and for at least one second predetermined address, the auxiliary input is de-asserted/asserted.

34. In a memory system having a first plurality of memory cells having a first bit line (A) associated therewith and a second plurality of memory cells having a second bit line (B) associated therewith, and wherein the memory system performs a plurality of access cycles to memory cells of the first and second pluralities of memory cells, a method for decreasing the access time to memory cells of the first and second pluralities of memory cells, said method comprising the steps of:

(a) pre-charging the first bit line with a first predetermined voltage level;

(b) thereafter pre-charging the second bit line with the first predetermined voltage level; and (c) simultaneous with said pre-charging step (b), accessing a selected memory cell of the first plurality of memory cells;

wherein the accessing step (c) comprises reading the selected memory cell including the step of:

comparing the voltages on the first and second bit lines for the presence or absence of the first predetermined voltage level thereby reading the state of the selected memory cell.

35. The method of claim 34 wherein the first predetermined voltage level comprises a substantially non-ground voltage level, the first and second pluralities of memory cells are programmable into a first or second state, and wherein the step of reading further includes, for one of the first and second states, the step of:

discharging the first predetermined voltage level from the first bit line in the selected memory cell.

36. The method of claim 35 wherein the step of comparing includes the step of:

NANDing or ANDing signal levels on the first and second bit lines.

37. The method of claim 34 wherein the accessing step comprises writing the selected memory cell.

38. The method of claim 34 wherein the predetermined voltage level comprises a substantially ground voltage level, the first and second pluralities of memory cells are programmable into a first or second state, and wherein the step of reading further includes, for one of the first and second states, the step of:

providing, on the first bit line and from the selected memory cell, a second predetermined voltage level.

39. The method of claim 38 wherein the step of comparing includes the step of:

NORing or ORing signal levels on the first and second bit lines.

40. The method of claim 34, further comprising the step of:

(d) simultaneous with said pre-charging step (a), accessing a selected memory cell of the second plurality of memory cells.

41. The method of claim 40, further comprising the step of:

(e) sequentially repeating steps (a) and (d) and steps (b) and (c) for a plurality of sequential memory accesses to the first and second pluralities of memory cells thereby providing multiple substantially interleaved access and pre-charge cycle times for the first and second pluralities of memory cells.

42. The method of claim 34 wherein the first and second pluralities of memory cells comprises SRAM cells.

43. In a memory system employed in a programmable gate array to control programmable resources therein, the memory system having a first plurality of memory cells having a first bit line (A) associated therewith and a second plurality of memory cells having a second bit line (B) associated therewith, and wherein the memory system performs a plurality of access cycles to memory cells of the first and second pluralities of memory cells, a method for decreasing the access time to memory cells of the first and second pluralities of memory calls, said method comprising the steps of:

(a) pre-charging the first bit line with a first predetermined voltage level;

(b) thereafter pre-charging the second bit line with the first predetermined voltage level; and (c) simultaneous with said pre-charging step (b), accessing a selected memory cell of the first plurality of memory cells;

wherein the first and second pluralities of memory cells comprise SRAM cells.

44. An apparatus for use in a memory system having a first plurality of memory cells having a first bit line (A) associated therewith and a second plurality of memory cells having a second bit line (B) associated therewith, and wherein the memory system performs a plurality of access cycles to memory cells of the first and second pluralities of memory cells, said apparatus for decreasing the access time to memory cells of the first and second pluralities of memory cells, said apparatus comprising:

(a) means for pre-charging the first bit line with a first predetermined voltage level;

(b) means for thereafter pre-charging the second bit line with the first predetermined voltage level; and (c) means for, simultaneous with said second bit line pre-charging, accessing a selected memory cell of the first plurality of memory cells;

wherein the means for accessing comprises means for reading the selected memory cell including:

means for comparing the voltages on the first and second bit lines for the presence or absence of the first predetermined voltage level and thereby reading the state of the selected memory cell.

45. The apparatus of claim 44 wherein the means for accessing comprises means for writing the selected memory cell.

46. The apparatus of claim 44 wherein the first predetermined voltage level comprises a substantially non-ground voltage level, the first and second pluralities of memory cells are programmable into a first or second state, and wherein the means for reading further includes, for one of the first and second states:

means for discharging the first predetermined voltage level from the first bit line in the selected memory cell.

47. The apparatus of claim 46 wherein the means for comparing includes:

means for NANDing or ANDing signal levels on the first and second bit lines.

48. The apparatus of claim 44 wherein the predetermined voltage level comprises a substantially ground voltage level, the first and second pluralities of memory cells are programmable into a first or second state, and wherein the means for reading further includes, for one of the first and second states:

means for providing, on the first bit line and from the selected memory cell, a second predetermined voltage level.

49. The apparatus of claim 48 wherein the means for comparing includes:

means for NORing or ORing signal levels on the first and second bit lines.

50. The apparatus of claim 44, further comprising:

(d) means for, simultaneous with said first bit line pre-charging, accessing a selected memory cell of the second plurality of memory cells.

51. The apparatus of claim 50, further comprising:

(e) means for sequentially repeating said pre-charging and accessing for a plurality of sequential memory accesses to the first and second pluralities of memory cells thereby providing multiple substantially interleaved access and pre-charge cycle times for the first and second pluralities of memory cells.

52. The apparatus of claim 44 wherein the first and second pluralities of memory cells comprise SRAM cells.

53. An apparatus for use in a memory system employed in a programmable gate array to control programmable resources therein, the memory system having a first plurality of memory cells having a first bit line (A) associated therewith and a second plurality of memory cells having a second bit line (B) associated therewith, and wherein the memory system performs a plurality of access cycles to memory cells of the first and second pluralities of memory cells, said apparatus for decreasing the access time to memory cells of the first and second pluralities of memory cells, said apparatus comprising:

(a) means for pre-charging the first bit line with a first predetermined voltage level;

(b) means for thereafter pre-charging the second bit line with the first predetermined voltage level; and (c) means for, simultaneous with said second bit line pre-charging, accessing a selected memory cell of the first plurality of memory cells;

wherein the first and second pluralities of memory cells comprise SRAM cells.

* * * * *

UNITED STATES PATENT AND TRADEMARK OFFICE
CERTIFICATE OF CORRECTION

PATENT NO. : 5,836,007
DATED : November 10, 1998
INVENTOR(S) : Clinton et al.

It is certified that error appears in the above-identified patent and that said Letters Patent is hereby corrected as shown below:

Col. 7, line 62, after "element.)", begin new paragraph with "Both conductors".

Col. 8, line 48, delete "VDD" and replace with --$V_{DD}$--.

In the Claims:

Claim 23 - Col. 17, line 35, delete "14" and replace with --19--.

Signed and Sealed this

Twenty-second Day of June, 1999

Attest:

Q. TODD DICKINSON

Attesting Officer

Acting Commissioner of Patents and Trademarks